United States Patent [19]
Hodges et al.

[11] Patent Number: 5,682,052
[45] Date of Patent: Oct. 28, 1997

[54] METHOD FOR FORMING ISOLATED INTRA-POLYCRYSTALLINE SILICON STRUCTURE

[75] Inventors: Robert Louis Hodges, Euless; Frank Randolph Bryant, Denton, both of Tex.

[73] Assignee: SGS-Thomson Microelectronics, Inc., Carrollton, Tex.

[21] Appl. No.: 412,919

[22] Filed: Mar. 29, 1995

Related U.S. Application Data

[62] Division of Ser. No. 100,617, Jul. 30, 1993, Pat. No. 5,460,983.

[51] Int. Cl.⁶ .......... H01L 29/76; H01L 29/94; H01L 31/062; H01L 31/113
[52] U.S. Cl. .......... 257/377; 257/347; 257/66
[58] Field of Search .......... 257/377, 347, 257/66

[56] References Cited

U.S. PATENT DOCUMENTS

| | | | |
|---|---|---|---|
| 4,663,827 | 5/1987 | Nakahara | 29/571 |
| 4,676,841 | 6/1987 | Celler | 148/1.5 |
| 4,929,566 | 5/1990 | Beitman | 437/24 |
| 5,266,523 | 11/1993 | Manning | 437/193 |
| 5,298,782 | 3/1994 | Sundaresan | 257/393 |

FOREIGN PATENT DOCUMENTS

| | | | |
|---|---|---|---|
| 0200603 | 11/1986 | European Pat. Off. | |
| 56-32742A | 4/1981 | Japan | 437/24 |
| 3726842A1 | 2/1988 | Netherlands | 437/24 |
| 2182489 | 5/1987 | United Kingdom | 437/24 |

OTHER PUBLICATIONS

Nuclear Instruments and Methods in Physics Research, B19/20 (1987) "Fabrication of Buried Layers of SiO2 and Si3N4 Using Ion Beam Synthesis," K.J. Reeson, pp. 269–278.

Materials Chemistry and Physics, 31 (1992), "Synthesis of Buried Insulating Layers in Silicon by Ion Implantation," A.M. Ibrahim & A.A. Berezin, pp. 285–300.

"Oxygen Distributions in Synthesized SiO2 Layers Formed by High Dose O+ Implantation into Silicon," PLF Hemment, et al., pp. 203–208, 1984, vol. 34.

*Primary Examiner*—Stephen Meier
*Attorney, Agent, or Firm*—Theodore E. Galanthay; Kenneth C. Hill; Lisa K. Jorgenson

[57] ABSTRACT

Therefore, according to the present invention, the isolation between adjacent intra-polycrystalline silicon layer components of one or more polycrystalline silicon layers of an integrated circuit device may be enhanced by patterning and then implanting one or more such polycrystalline silicon layers with a high dose of oxygen or nitrogen, in the range of approximately $1\times10^{19}/cm^2$ to $1\times10^{17}/cm^2$. A post implant anneal is performed in either nitrogen or argon to form a layer of either silicon dioxide or silicon nitride having desirable planar characteristics. The anneal is performed at a temperature range of approximately 1000 to 1400 degrees Celsius.

7 Claims, 4 Drawing Sheets

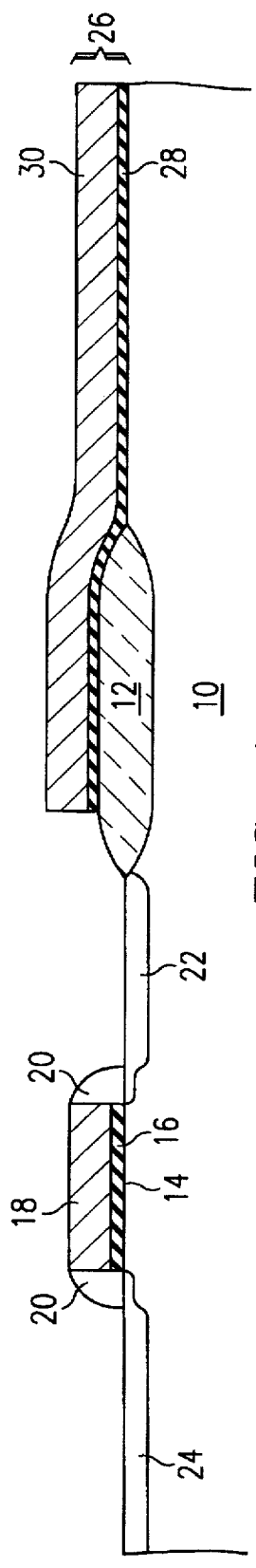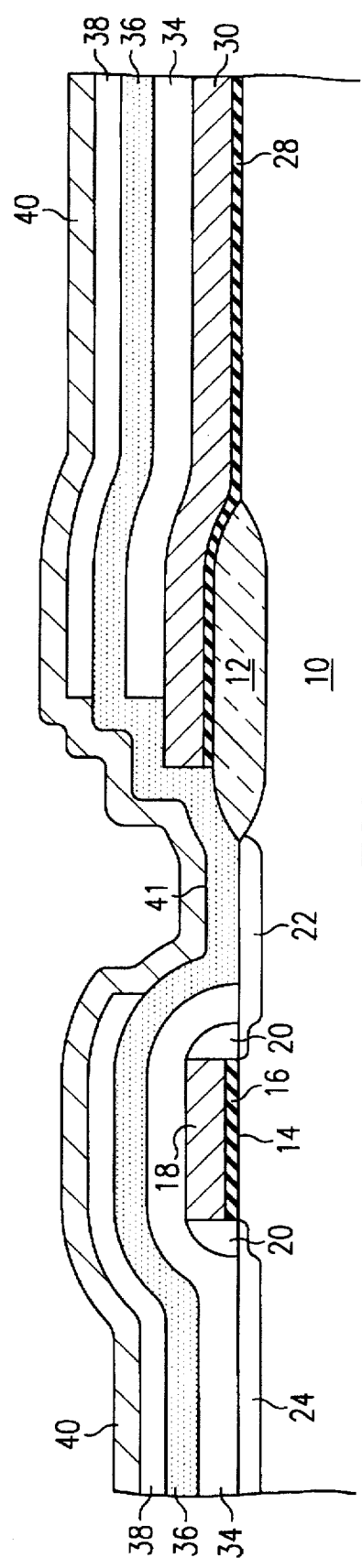

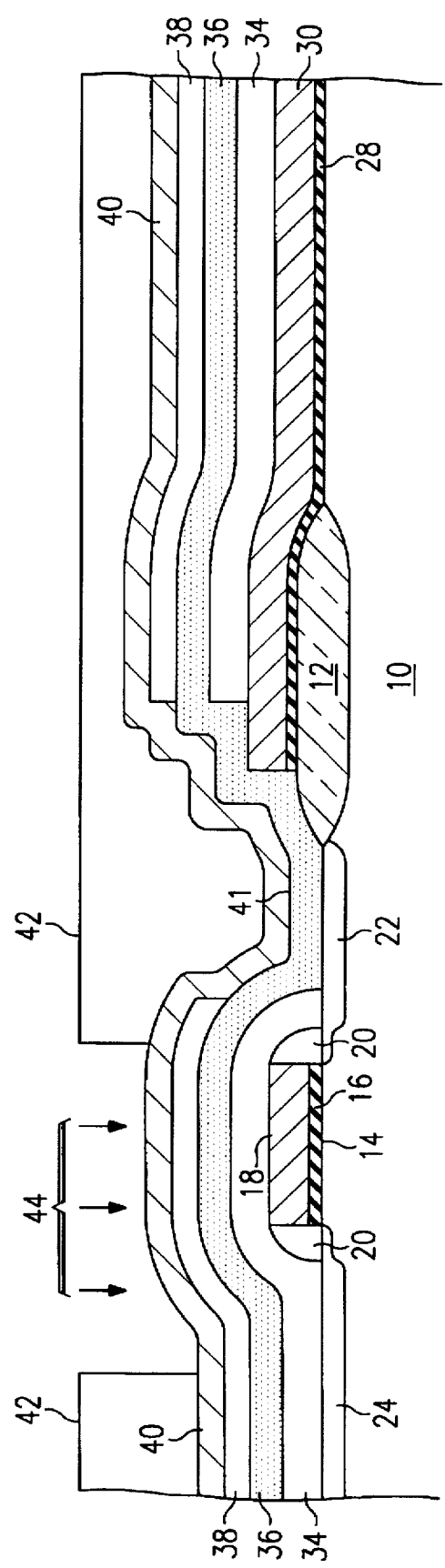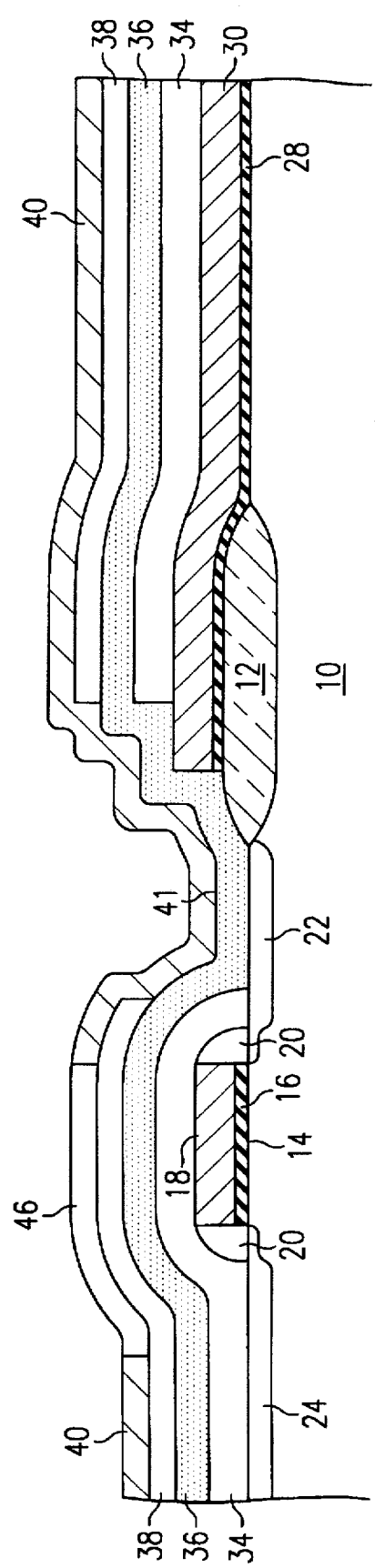

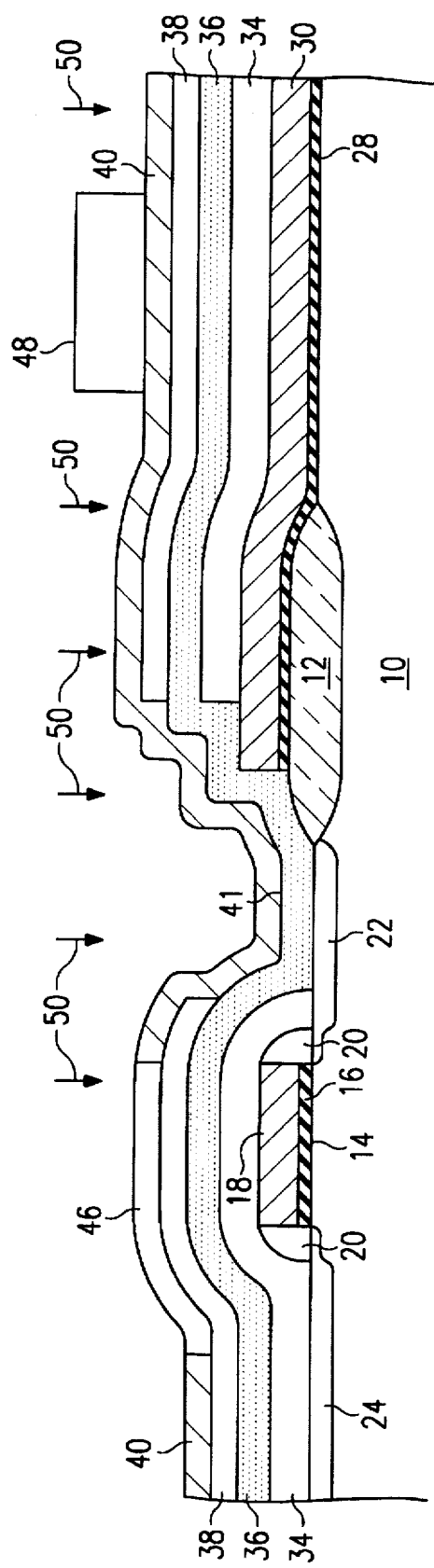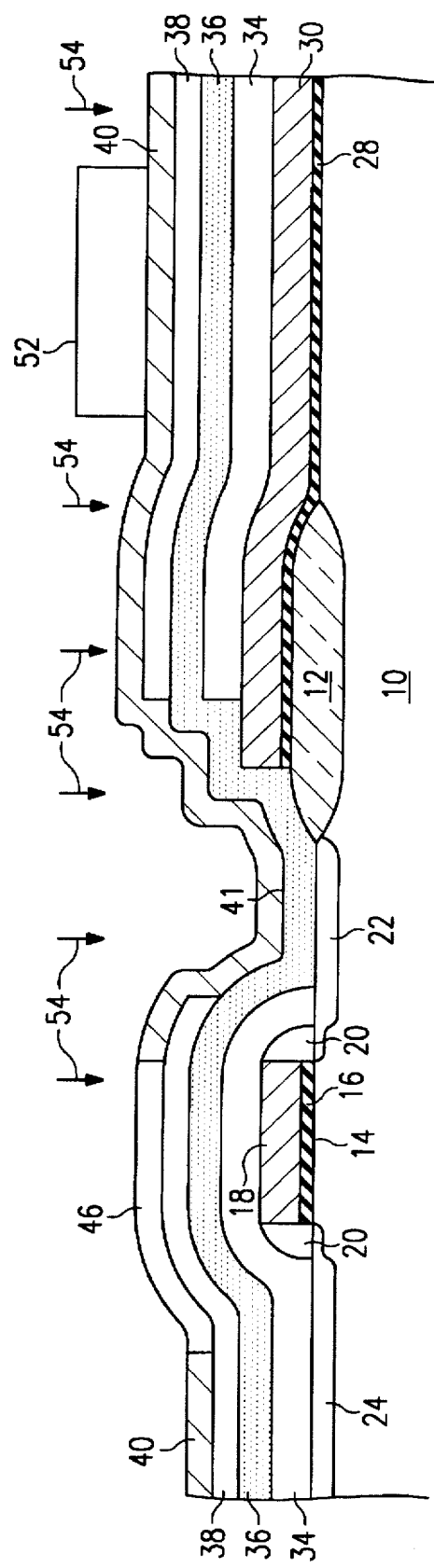

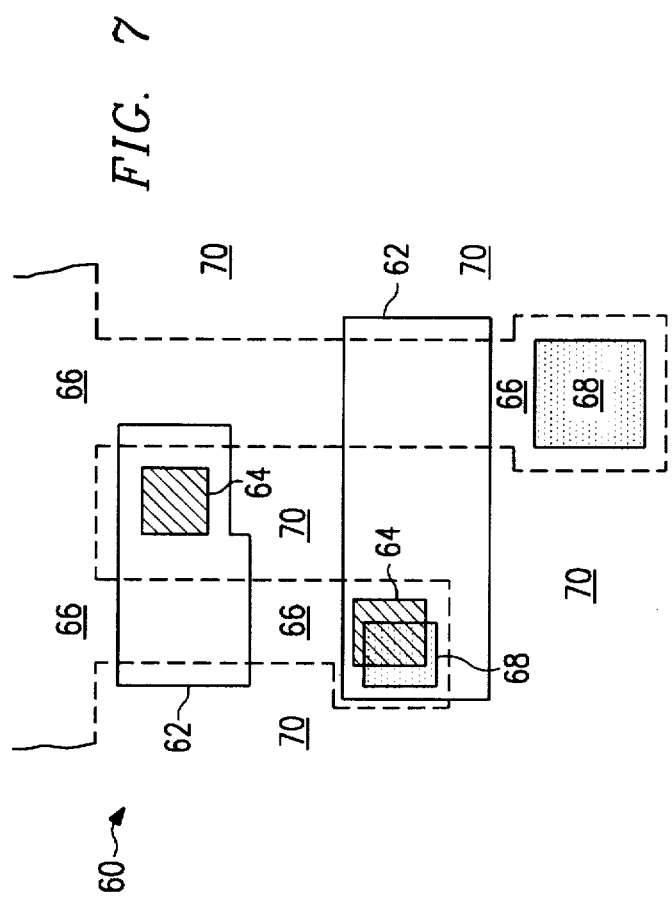
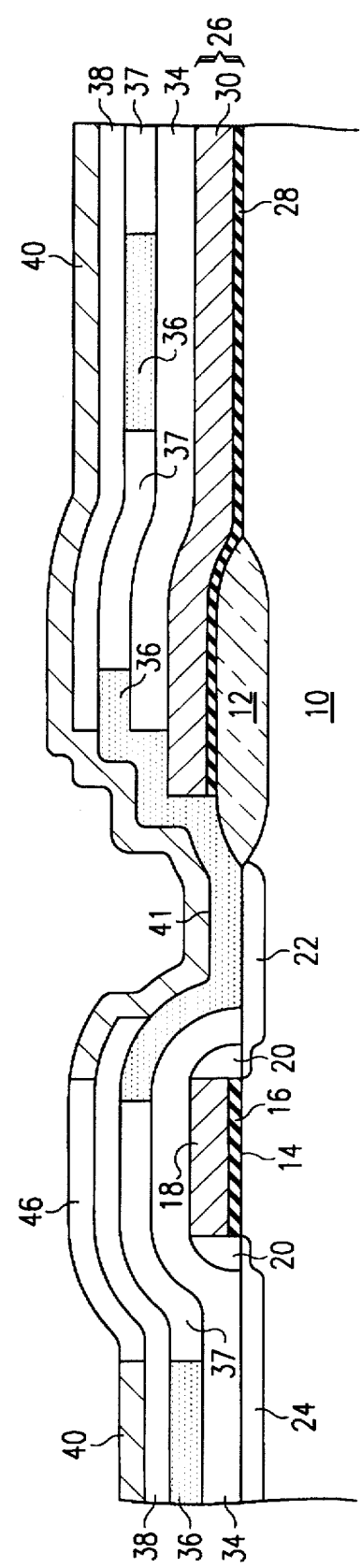

METHOD FOR FORMING ISOLATED INTRA-POLYCRYSTALLINE SILICON STRUCTURE

This is a Division of application Ser. No. 08/100,617, filed Jul. 30, 1993 now U.S. Pat. No. 5,460,983.

BACKGROUND OF THE INVENTION

1. Field of the Invention

The present invention relates generally to the isolation of intra-polycrystalline silicon structures, and more specifically to integrated circuit devices, including thin film transistor (TFT) structures.

2. Description of the Prior Art

Sufficient isolation between adjacent active components in a polycrystalline silicon layer of an integrated circuit device is often critical to the proper electrical function of the device. Insufficient isolation may cause a variety of problems, including leakage current and potential electrical shorts between such intra-polycrystalline silicon layer components. And, if the device is stressed by environmental factors such as high-voltage or high-radiation, isolation becomes more of a concern.

In the manufacture of polycrystalline silicon devices, it is common in the art to utilize a patterning and dry etching process to remove selected portions of a polycrystalline silicon layer between adjacent intra-polycrystalline silicon components. Due to factors such as poor etch selectivity, small amounts of polycrystalline silicon, known as stringers in the processing art, may be left behind. Stringers can contribute to leakage current and electrical shorting between adjacent intra-polycrystalline silicon components. Attempts to eradicate stringers by deeper etching has proved only partially successful, due to selectivity problems, and overetching can cause punch-through or puncturing of underlying layers. Additionally, dry etching of polycrystalline silicon layers may adversely affect device topography and therefore device planarity.

The dry etch problems described above are exacerbated for thin film transistor (TFT) devices which lend themselves to high density, high speed applications, such as video display chips for flat-screen applications. For TFT devices, isolation and planarity are especially desirable characteristics. However, current methods for manufacturing TFT devices call for the patterning and etching of various polycrystalline silicon layers, which can result in insufficient device isolation and undesirable device topography. For example, patterning and then etching the third polycrystalline silicon layer of a three polycrystalline silicon layer device may not completely remove the third polycrystalline silicon layer, leaving behind stringers of the third polycrystalline silicon layer. Such stringers would adversely affect isolation between adjacent third polycrystalline silicon layer components.

As a result of the well known problems associated with patterning and etching polycrystalline silicon layers in the manufacture of integrated circuit devices, including TFT devices, it would be desirable to utilize a method which patterns a polycrystalline silicon layer and then removes the desired portion of that polycrystalline silicon layer. Such a method would enhance device isolation.

SUMMARY OF THE INVENTION

It is therefore an object of the present invention to enhance isolation between adjacent intra-polycrystalline silicon layer components of one or more polycrystalline silicon layers of an integrated circuit device.

The isolation between adjacent intra-polycrystalline silicon layer components of one or more polycrystalline silicon layers of an integrated circuit device may be enhanced by patterning and then implanting one or more such polycrystalline silicon layers with a high dose of oxygen or nitrogen, in the range of approximately $1\times10^{17}/cm^2$ to $1\times10^{19}/cm^2$. A post implant anneal is performed in either nitrogen or argon to form a layer of either silicon dioxide or silicon nitride having desirable planar characteristics. The anneal is performed at a temperature range of approximately 1000 to 1400 degrees Celsius.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1–8 illustrate a preferred method for forming an isolated TFT structure by implantation, according to the present invention.

DESCRIPTION OF THE PREFERRED EMBODIMENT

The process steps and structures described below do not form a complete process flow for manufacturing integrated circuits. Rather, the present invention may be practiced in conjunction with integrated circuit fabrication techniques currently known in the art, and only so many of the commonly practiced process steps are included as are necessary to provide an understanding of the present invention. The figures representing cross-sections of portions of an integrated circuit during fabrication are not drawn to scale, but instead are drawn so as to illustrate the important features of the present invention.

Referring to FIG. 1, an integrated circuit device is to be formed in a silicon substrate 10. Selected regions of the substrate 10 are oxidized to form a field oxide insulating region 12. A first N-channel field effect device 14 having a gate oxide layer 16, a first gate electrode 18, sidewall oxide spacers 20 and source/drain regions 22, 24 are manufactured by methods well known in the art. A second N-channel field effect device 26 is formed by methods known in the art having a gate oxide layer 28 and a second gate electrode 30; gate oxide layer 28 is formed at the same time that gate oxide layer 16 of device 14 is formed. As with the first N-channel field effect device 14, the second N-channel field effect device 26 is generally formed from a first polycrystalline silicon layer. The source/drain region 22 of device 14 and the gate electrode 30 form the interconnected conductive structures of the N-channel devices.

Referring to FIG. 2, a first oxide insulating layer 34 is formed over the integrated circuit by known methods. Insulating layer 34 is patterned and etched to expose a portion of the underlying conductive structure source/drain region 22 of device 14. A portion of the second gate electrode 30 of the second N-channel device 26 may also be exposed during the patterning and etching steps. Source/drain region 22 of the first N-channel field effect device is typically implanted with an N+ type dopant such as arsenic or phosphorus, Gate electrode 30 is usually in-situ doped or phosphorous doped using $POCl_3$ during a phosphorous deposition.

Second gate electrode and polycrystalline silicon layer 30 is patterned and etched prior to chemical vapor deposition (CVD) of oxide 34 onto polycrystalline silicon layer 30 in the range of 300 to 2000 Angstroms. Polycrystalline silicon layer 36 is then deposited on the device and etched to define interconnect regions, followed by a thin film transistor gate implant of phosphorous of greater than $1\times10^{19}/cm^3$ which makes polycrystalline silicon layer 36 N+ conductivity material; phosphorous or other N+-type material could also be deposited instead of implanted. Besides phosphorous, another N+ dopant material which could be used is arsenic. Next thin film transistor gate oxide deposition results in oxide insulating layer 38 which is followed by gate oxide densification. Densification of oxide insulating layer 38 could be performed in diluted $O_2$, $N_2$, or $H_2O$.

For the TFT technology shown in FIG. 2, the shared contact 41 between polycrystalline silicon layers 36 and 40 is formed when oxide layer 38 is deposited on polycrystalline silicon layer 36 and then patterned and etched. Next, polycrystalline silicon layer 40 may be formed by a variety of methods, including hydrogenation or deposition followed by an anneal. As an example, amorphous silicon may be deposited followed by solid phase epitaxial growth (SPG) anneal to form polycrystalline silicon layer 40. Amorphous deposition of silicon, with large grains as close to a single crystal transistor as possible, is desired. Therefore, low temperature poly deposition of less than 600 degrees Celsius may be used; laser recrystallization and anneal can also be used to enhance grain size. Additionally, hydrogen passivation can be performed to enhance device integrity. If desired, thin film transistor channel implantation may be performed.

The prior art practice of patterning and etching a polycrystalline silicon layer is replaced by the patterning and implanting steps described in FIGS. 3 and 4 below. Referring to FIG. 3, photoresist 42 is positioned so as to protect active regions of polycrystalline silicon layer 40 as well as the contact region 41 between polycrystalline silicon layers 40 and 36. Next, separation by implanted oxygen (SIMOX) is accomplished by patterning polycrystalline silicon layer 40 followed by a high dose oxygen implantation 44 of polycrystalline silicon layer 40 not covered by photoresist 42. The implantation dosage is approximately $1\times10^{17}/cm^2$ to $1\times10^{19}/cm^2$ for a 500 Angstrom silicon film. Polycrystalline silicon layer 40 may also be implanted with nitrogen instead of oxygen.

The implantation of FIG. 3 is followed by a post implant anneal in argon or nitrogen as shown in FIG. 4. Silicon dioxide 46 is formed where polycrystalline silicon layer 40 was implanted with a high dose of oxygen, and silicon nitride is formed where polycrystalline silicon layer 40 was implanted with a high dose of nitrogen. The post implant anneal may be performed in either a nitrogen or an argon environment having a temperature range of approximately 1000 degrees Celsius to 1400 degrees Celsius. Depending on the thermal budget for a particular device, the anneal may be either a furnace anneal or a rapid thermal anneal (RTA). Generally speaking, an argon or nitrogen RTA is appropriate for SRAMs and other memory devices having a more restrictive thermal budget, while a furnace anneal is suitable for most other device types.

Next, standard TFT device process steps are performed. As shown in FIG. 5, photoresist 48 is placed at an offset such that polycrystalline silicon layer 40 may be implanted 50 with dosages of P+ dopant materials such as Boron or BF2. Next, the strategic placement of photoresist 52 defines the source and drain regions which may be implanted with heavier dosages 54, P++ for instance, of Boron or BF2 as shown in FIG. 6. It should be noted that the offset implant 50 shown in FIG. 5 is an optional process step. If the offset implant 50 is not done, photoresist 48 instead of photoresist 52 should be used to perform the source/drain implant of FIG. 6.

Referring now to FIG. 7, a representative top view of an isolated three layer polycrystalline silicon structure 60, according to the present invention, is shown. The unimplanted portion of the third polycrystalline silicon layer 66 and the implanted and annealed portion of the third polycrystalline silicon layer 70, as well as second polycrystalline silicon layer 62 as shown. Area 70 is the result of patterning and implanting a portion of the third polycrystalline silicon layer 66 followed by an anneal step. Second polycrystalline silicon layer contact regions 64, usually comprised of $N^+$ material, and third polycrystalline silicon layer contact region 68 are also shown. The resultant polycrystalline silicon structure 60 provides better isolation of components in the third polycrystalline silicon layer 70.

As may be seen by the relatively flat shape of silicon dioxide layer 46 of FIG. 4, implanting instead of etching removed most of the desired portions of polycrystalline silicon layer 40, thereby reducing stringer phenomenon and increasing device planarity. An even more planar structure may be obtained by using the patterning and implanting steps of FIGS. 3 and 4 on other polycrystalline silicon layers. For example, a more planar structure would result if polycrystalline silicon layers 36 and 40 were both patterned and implanted. Referring now to FIG. 8, polycrystalline silicon layer 36 has been implanted with a high dose of oxygen or nitrogen on the order of approximately $1\times10^{17}/cm^2$ to $1\times10^{19}/cm^2$ for a 500 Angstrom silicon film, followed by an anneal at a temperature of approximately 1000 to 1400 degrees Celsius to produce silicon oxide or silicon nitride 37 between adjacent active components in polycrystalline layer 36. Similarly, polycrystalline silicon layer 40 has been implanted and annealed with the process steps outlined above in FIGS. 3 and 4. Applying the implanting and annealing steps to more than one polycrystalline silicon layer results in a more planar structure as shown in FIG. 8.

A process for manufacturing isolated intra-polycrystalline silicon layer devices, specifically TFT devices, using high dosage implantation has been described. The use of implanting rather than etching provides for a more complete removal of one or more polycrystalline silicon layers, thereby resulting in better isolated device components in the polycrystalline silicon layers which are implanted. Increased isolation reduces problems of the prior art such as leakage current between adjacent device components. Additionally, the implantation technique of the present invention positively affects device topography, yielding more planar polycrystalline silicon layers.

While the invention has been particularly shown and described with reference to a preferred embodiment, it will be understood by those skilled in the art that various changes in form and detail may be made therein without departing from the spirit and scope of the invention. Even though the present invention was described in relation to TFT devices, one skilled in the art will appreciate the applicability of the present invention to a wide variety of integrated circuit devices, including TFT devices, and SRAMs or other memory devices.

What is claimed is:

1. A portion of a multiple layer integrated circuit device, comprising:

first and second field effect transistors in a substrate, each field effect transistor having a gate formed from a first patterned layer of polycrystalline silicon and source/drain regions formed in the substrate;

a first oxide layer over the field effect transistors and the substrate;

an opening through the first oxide layer in a contact region, wherein a source/drain region of the first field effect transistor is exposed in the opening;

a second layer of patterned polycrystalline silicon over the first oxide layer and in the opening to make contact with the exposed source/drain region;

a second layer of oxide over the second polycrystalline silicon layer and the first oxide layer;

a third layer over the second oxide layer, wherein first portions of the third layer are polycrystalline silicon and second portions of the third layer are an insulating material formed from polycrystalline of the third layer, and wherein the first portions of the third layer define a patterned interconnect which includes source/drain and channel regions having been formed by implanted impurities.

2. The integrated circuit of claim 1, wherein the insulating material has been implanted with an oxygen dosage of between $1 \times 10^{17}/cm^2$ to $1 \times 10^{19}/cm^2$.

3. The integrated circuit of claim 2, wherein the insulating material is formed by annealing the third layer and the insulating material is silicon dioxide.

4. The integrated circuit of claim 3, wherein the third layer is annealed at a temperature range of between approximately 1000 to 1400 degrees Celsius.

5. The integrated circuit of claim 1, wherein the insulating material has been implanted with a nitrogen dosage of between $1 \times 10^{17}/cm^2$ to $1 \times 10^{19/cm2}$.

6. The integrated circuit of claim 5, wherein the insulating material is formed by annealing the third layer and the insulating material is silicon nitride.

7. The integrated circuit of claim 6, wherein the third layer is annealed at a temperature range of between approximately 1000 to 1400 degrees Celsius.

* * * * *